US008611072B2

(12) United States Patent
Adema et al.

(10) Patent No.: US 8,611,072 B2
(45) Date of Patent: Dec. 17, 2013

(54) THERMAL ACTUATOR FOR CONFIGURABLE IMAGING SYSTEMS

(75) Inventors: Dan Adema, Kitchener (CA); Bryan Hemphill, Waterloo (CA); Les Hirst, Waterloo (CA)

(73) Assignee: Christie Digital Systems USA, Inc., Cypress ( * ) Notice: Subject to any disclaimer, the term of this patent is extended or adjusted under 35 U.S.C. 154(b) by 884 days.

(21) Appl. No.: 12/781,115

(22) Filed: May 17, 2010

(65) Prior Publication Data

US 2011/0279352 A1 Nov. 17, 2011

(51) Int. Cl.
*H05K 7/00* (2006.01)

(52) U.S. Cl.
USPC ........ 361/679.01; 60/527; 236/49.1; 345/1.3; 454/184; 454/258

(58) Field of Classification Search
USPC .......... 361/679.01, 679.04; 60/527; 236/49.1; 345/1.3; 454/184, 258
See application file for complete search history.

(56) References Cited

U.S. PATENT DOCUMENTS 2,696,086 A * 12/1954 Jones ................................ 62/65
4,340,172 A * 7/1982 Poore .............................. 236/13
4,974,073 A 11/1990 Inova
5,136,390 A 8/1992 Inova et al.
5,346,130 A * 9/1994 Rademaker .................. 236/49.5
5,767,818 A 6/1998 Nishida
6,012,420 A * 1/2000 Dykstra et al. ........... 123/179.18
6,081,375 A 6/2000 Furuya et al.
6,115,022 A 9/2000 Mayer, III et al.
6,219,011 B1 4/2001 Aloni et al.
6,335,829 B1 1/2002 Van De Voorde
6,501,441 B1 12/2002 Ludtke et al.
6,550,521 B1 4/2003 McNabb
6,736,326 B2 * 5/2004 Hunka .......................... 236/1 C
6,741,222 B1 * 5/2004 Tucker ........................... 345/1.1
6,760,075 B2 7/2004 Mayer, III et al.
6,771,307 B2 8/2004 Waki et al.
6,791,513 B2 9/2004 Ogino et al.
6,799,836 B2 10/2004 Silverbrook
6,857,577 B2 * 2/2005 Hunka ......................... 236/49.5
6,956,541 B2 10/2005 McClintok
7,157,838 B2 * 1/2007 Thielemans et al. ............ 313/35
7,248,229 B2 7/2007 Zerphy et al.

(Continued)

FOREIGN PATENT DOCUMENTS

DE 4006189 9/1991
JP 04361248 A * 12/1992 ............ G03B 21/10

(Continued)

OTHER PUBLICATIONS

European Search Report mailed Oct. 26, 2009 in related European Patent Application 09009079.6.

(Continued)

*Primary Examiner* — Robert J Hoffberg
(74) *Attorney, Agent, or Firm* — Perry + Currier Inc.

(57) ABSTRACT

For use in an imaging system having a plurality of adjacent display units, the improvement comprising a thermal actuator in at least one of the display units for moving a screen thereof away from a chassis thereof when the said display unit exceeds a predetermined temperature, so as to prevent mechanical interference between the adjacent display units.

9 Claims, 4 Drawing Sheets

(56) References Cited

U.S. PATENT DOCUMENTS

| | | | | |
|---|---|---|---|---|
| 7,742,120 | B2 * | 6/2010 | Bayley et al. | 349/58 |
| 7,806,345 | B2 * | 10/2010 | Tsunekawa et al. | 237/49 |
| 7,918,565 | B2 * | 4/2011 | Hemphill et al. | 353/78 |
| 8,240,857 | B2 * | 8/2012 | Hemphill et al. | 353/78 |
| 2001/0026326 | A1 | 10/2001 | Itaki et al. | |
| 2005/0018040 | A1 | 1/2005 | Buchner et al. | |
| 2005/0219467 | A1 | 10/2005 | Nomizo et al. | |

FOREIGN PATENT DOCUMENTS

| | | | | | |
|---|---|---|---|---|---|
| JP | 08-088820 | A | | 4/1996 | |
| JP | 09292144 | A | * | 11/1997 | F24F 7/00 |
| JP | 2000-276099 | A | | 10/2000 | |
| JP | 2002-162689 | A | | 6/2002 | |
| WO | 99/13377 | A | | 3/1999 | |
| WO | 99/29117 | A | | 6/1999 | |
| WO | 00-18138 | A1 | | 3/2000 | |
| WO | 00-18139 | A1 | | 3/2000 | |
| WO | 2006-115852 | | | 11/2006 | |

OTHER PUBLICATIONS

Ezekiel S. Bhasker et al: "Asynchronous Distributed Calibration for Scalable and Reconfigurable Multi-Projector Displays" IEEE Transactions on Visualizationa nd Computer Graphics, IEE Service Center, Los Alamitos, CA, US, vol. 12, No. 5, Sep. 1, 2006, pp. 1101-1108, XP011150906, ISSN 1077-2626.

European Search Report mailed Oct. 29, 2008 in related European Patent Application No. 08251680.8.

* cited by examiner

THERMAL ACTUATOR FOR CONFIGURABLE IMAGING SYSTEMS

FIELD

The present invention relates to configurable imaging systems having a plurality of display units for generating respective portions of a composite image, and more particularly to a thermal actuator for use with a display unit of a configurable imaging system to minimize mechanical stress resulting from thermal expansion.

BACKGROUND

A large number of applications and potential applications exist for imaging systems such as projection displays that are used to display information. Such applications include, but are not limited to, general indoor signage (e.g. shopping malls, arcades, etc.), transportation signage (e.g. arrival/departure times, etc.), in-lobby signage for office buildings, control rooms, restaurants signage, etc.

It is known to provide large displays for signage and the like by assembling a multiplicity of individual display units in an array (see, for example, United States Patent Publication No. 2008/0284675, the contents of which are incorporated herein by reference). The construction of each individual display unit may include a chassis for housing projection lamps, electronic circuits, etc., and a rear projection screen. Typically, the chassis is metallic whereas the rear projection screen is plastic; resulting in a mismatch of thermal expansion coefficients (i.e. the screen expands at a faster rate than the chassis). Therefore, in order to build an array of display units capable of operation over a wide range of environmental temperatures, the thermal expansion coefficient mismatch must be accounted for.

One method of accounting for thermal expansion is to undersize the screen so that at elevated temperatures the screen does not exceed the chassis size and cause interference with a neighbouring display unit. However, this solution is not desirable since it results in large gaps between adjacent display unit screens at nominal temperatures, in order to accommodate thermal expansion at elevated temperatures. Large gaps between adjacent screens have the potential to interfere with the optical transition from one display to the next, thereby reducing overall image quality. Another, less optimal alternative is to allow minor interference collisions within predetermine tolerance limits that do not cause damage to either the screen or chassis. However, it is difficult to manufacture display units with sufficiently high tolerance limits as to avoid damage caused by interference between adjacent units at elevated temperatures and gaps between units at nominal temperatures.

Yet another solution is to fabricate the chassis and display screen from the same material so that the chassis and screen exhibit similar thermal expansion characteristics. To achieve this, the chassis may be constructed of plastic having a comparable coefficient of thermal expansion (CTE) to the screen assembly. As the screen expands, so too does the chassis, thereby maintaining the expansion differential to a minimum. Unfortunately, a plastic chassis has potentially poor performance with respect to dimensional stability, particularly as it relates to component positioning. For example, a plastic chassis may twist and distort as it expands and contracts, resulting in misalignment of the optical components.

BRIEF DESCRIPTION OF THE DRAWINGS

Embodiments will now be described, by way of example only, with reference to the attached Figures, wherein.

A skilled person in the art will understand that the drawings are for illustrative purposes only. The drawings are not intended to limit the scope of the applicant's teachings in any way.

DESCRIPTION OF EXEMPLARY EMBODIMENTS

Figure 1:
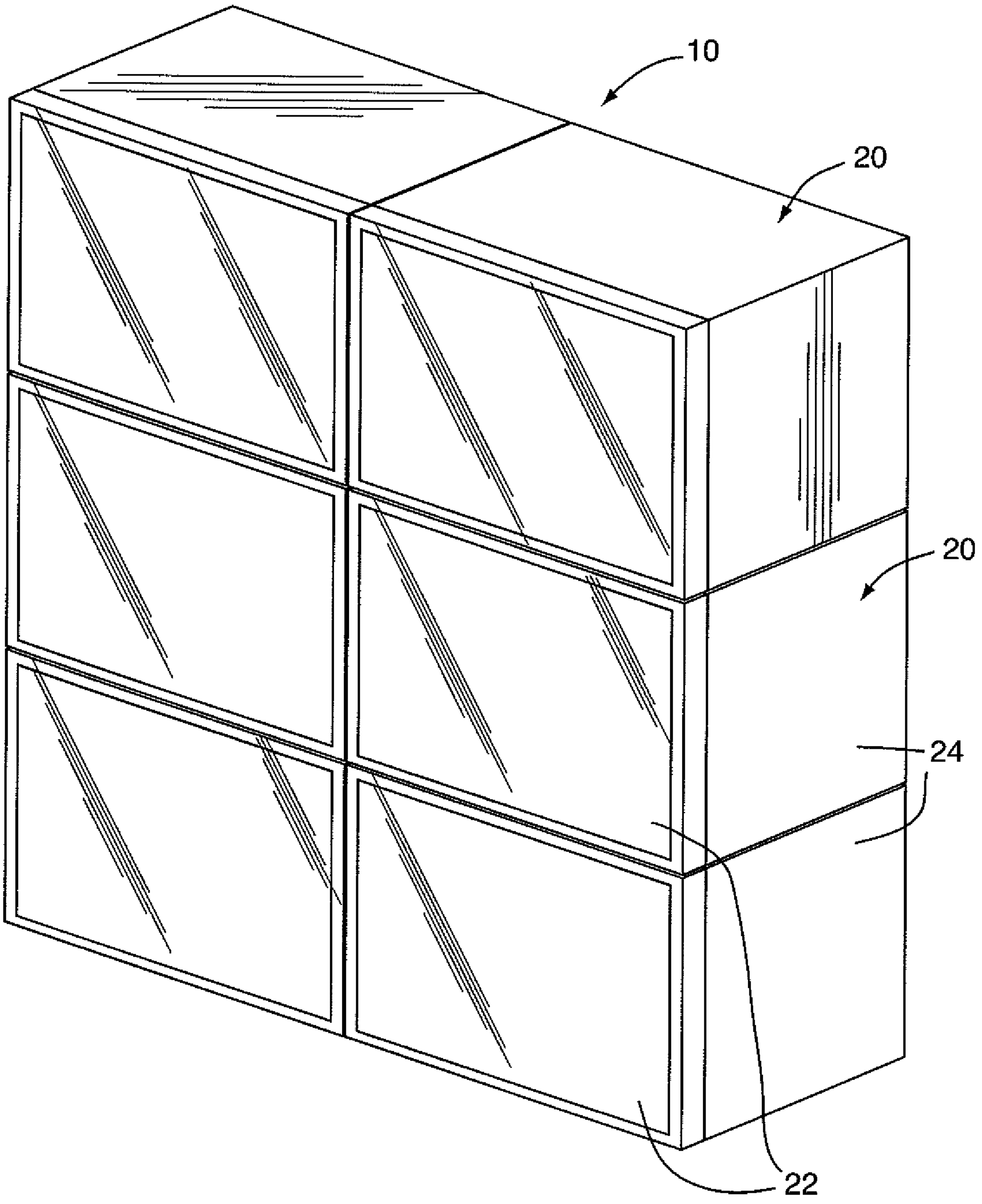
FIG. 1 shows a configurable imaging system having a plurality of display units for generating respective portions of a composite image.

In FIG. 1, an exemplary imaging system 10 is shown comprising a plurality of imaging units 20 assembled to form an array. Exemplary units are described in Applicant's co-pending United States Patent Publication No. 2008/0284675. The front surface of each display unit 20 comprises a rear projection screen 22 that is pivotally connected to a chassis 24, as described in greater detail below.

In order to provide dimensional stability, the chassis 24 of each display unit 20 is configured to generally comprise a rigid frame, whereas the screen 22 is preferably made from a plastic material, such as Polymethyl methacrylate (PMMA), Styrene Methyl Methacrylate Acrylic copolymer (SMMA), glass, acrylic, polycarbonate, Polyethylene terephthalate (PET), or any suitable clear or mostly clear plastic. The rigid frame may also be configured to permit mounting of the display unit 20 to a supporting structure, such as a wall. Non-limiting examples of suitable materials for the chassis include aluminum, magnesium, and glass-filled nylon.

Within the chassis 24 of each display unit 20 are a plurality of electronic and optical components (not shown) for displaying images on the screen 22. According to an exemplary embodiment, the electronic and optical components may include a small rear projector, including a light source, light valve, optics and associated electronics. The light source may, for example, be implemented using LEDs, although it is contemplated that lasers or other light sources may be utilized, the selection and implementation of which would be known to a person of ordinary skill in the art. The chassis 24 may also contain a light engine and associated circuitry (including, for example, a microprocessor, RAM frame buffer, and video processing to provide image capture, resizing, color matching, edge blending, etc). It will be appreciated that the various electronic and optical components generate heat within the unit 20.

As discussed above, each unit 20 projects a portion of a composite image (preferably at SVGA resolution to enable small pixel pitch (under 1 mm)). For example, United States Patent Publication No. 2008/0284675 discloses fully configurable display units (i.e. they are not required to be arranged in rectangular configurations), resulting in significant flexibility in terms of display design.

Regardless of the arrangement, coupling mechanisms permit physical registration or alignment of each display unit 20 with each vertically and/or horizontally adjacent display unit 20, for example via matching protrusions and indentations on respective surfaces of each display unit chassis 24.

As discussed above, where the screen materials (generally comprising the screen, lenticular, diffusion layers, Fresnel, etc.) exhibit thermal expansion characteristics that differ (e.g. exceed) from that of the chassis, an expansion differential can result. Changes in temperature can arise from a number of sources, including, but not limited to operation of the display unit, and changes in the ambient temperature in which the display unit is located. To account for this thermal expansion, it is known to provide a nominal gap between adjacent screens 22 in order to avoid potentially damaging screen compression or collision. While such a gap may be sized large enough to permit for thermal changes in screen size, it will be appreciated that a large gap between adjacent screens may interfere with the optical transition from one display unit 20 to the next, thereby reducing overall image quality.

Table 1 provides an exemplary set of thermal expansion characteristics of a rigid chassis compared to a screen.

TABLE 1

Thermal Expansion of Chassis and Screen (no interface pad)

| Component | Nominal Width (mm) | CTE (mm/m-10 C.) | Width increase over 40 C. (mm) | Width at Temp (mm) |
|---|---|---|---|---|
| Chassis | 408 | 0.259 | 0.42 | 408.42 |
| Screen | 408 | 0.67 | 1.09 | 409.09 |
| | Gap Required | | | 0.67 |

While both the chassis and screen are dimensioned with a nominal width of 408 mm, the actual width of each component at operating temperature (e.g. 40° C. higher) differs as the CTE of the chassis is lower than the CTE of the screen. As shown, the screen expands to a total width of 409.09 mm, while the chassis expands to a total width of 408.42, representing a 0.67 mm difference. In this scenario, because the screen expands to a greater extent than the chassis, significant gaps between adjacent screens would be required to avoid potentially damaging compression/collision.

Figure 2:
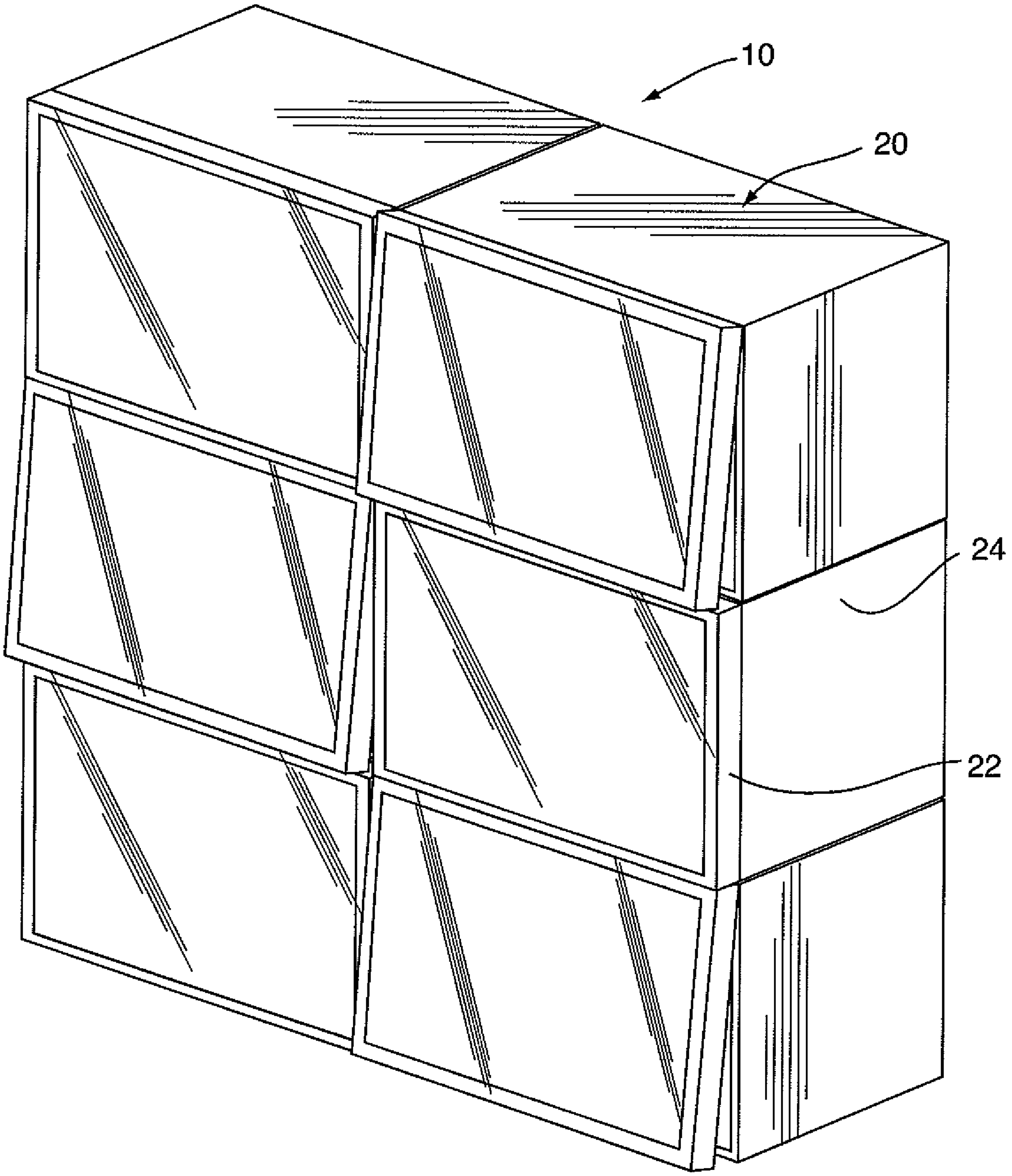
FIG. 2 shows the configurable imaging system of FIG. 1 wherein the display screens of certain ones of the display units are pivoted outward, according to an embodiment of the invention, so as to minimize interference between adjacent display screens at elevated operating temperatures.

Therefore, in accordance with the embodiment of FIG. 2, once the temperature of a display unit 20 exceeds a predetermined threshold (e.g. 40° C.), the screen 22 is caused to pivot to a new position, as shown in FIG. 2, where interferences (if any) between adjacent units 20 are minimal.

Figure 3:
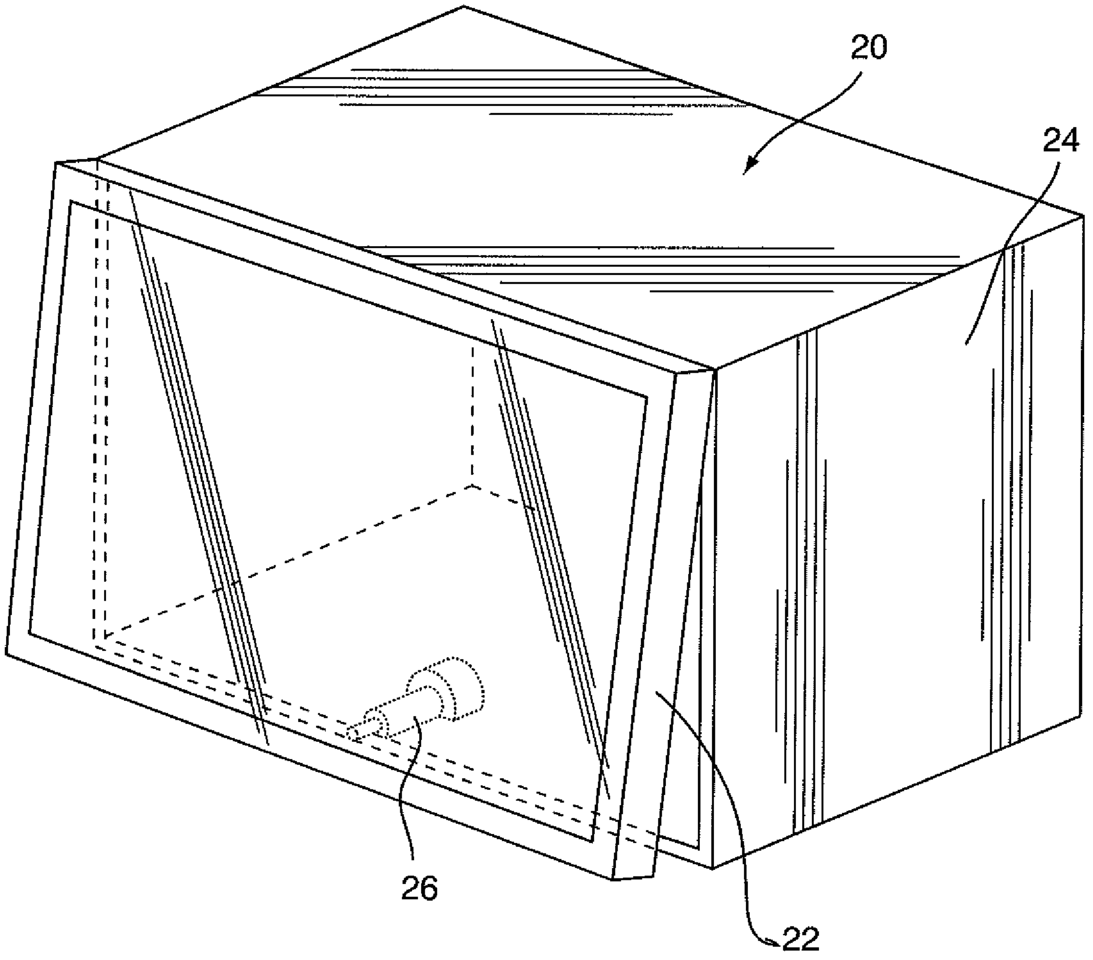
FIG. 3 shows the pivoting mechanism of a display unit shown in FIGS. 1 and 2, according to an exemplary embodiment.

According to the embodiment shown in FIG. 3, a thermal actuator 26 is mounted on the rigid chassis 24. The actuator preferably comprises a stationary component mounted to the chassis and a linear translation element in contact with (e.g. connected to) the screen 22 and adapted to be moved by the stationary component so as to push the screen 22 outward and away from the chassis 24 above a predetermined temperature (e.g. 40° C.) or above a percentage of the predetermined temperature (e.g., 75% of the 40° C. screen collision temperature in Table A). For example, the nominal gap between display units 20 may be 0.5 mm at 20° C., such that when the temperature rises from 20° C. to 40° C., the screen may expand by approximately 0.5 mm, which means there is no longer a gap. Any further increase in temperature may then result in activation of the thermal actuator 26 so as to pivot the screen(s) 22 outwardly, such that collision between adjacent screens is averted.

Figure 4:
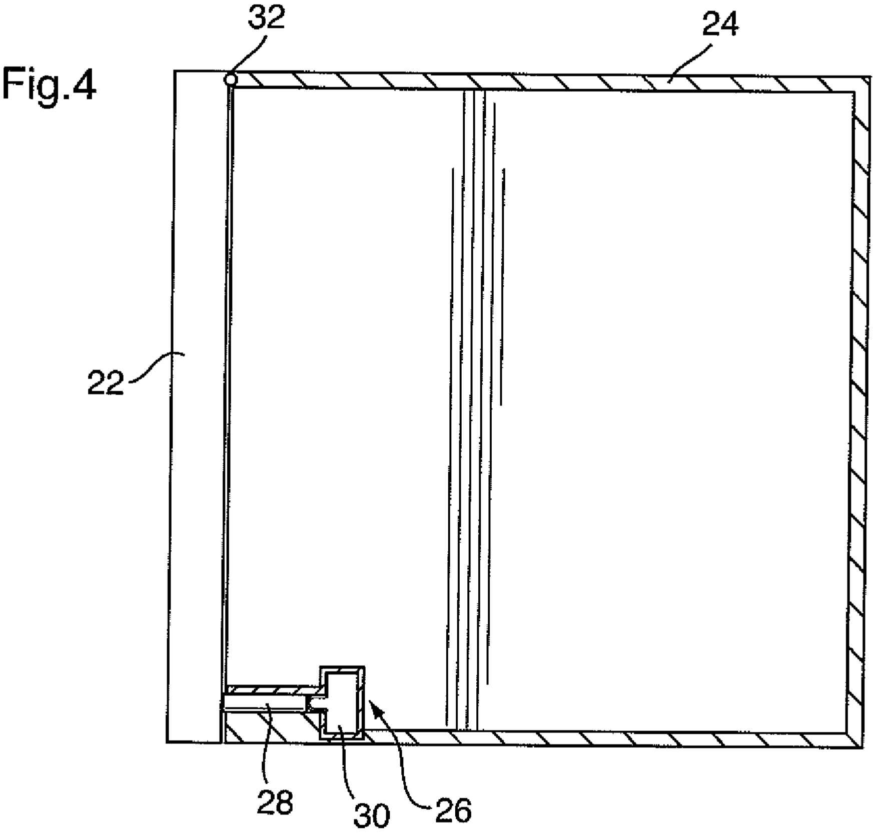
FIG. 4 is a cross-sectional view of the display unit in FIG. 3, showing the screen in a closed position for operation at nominal temperatures.
Figure 5:
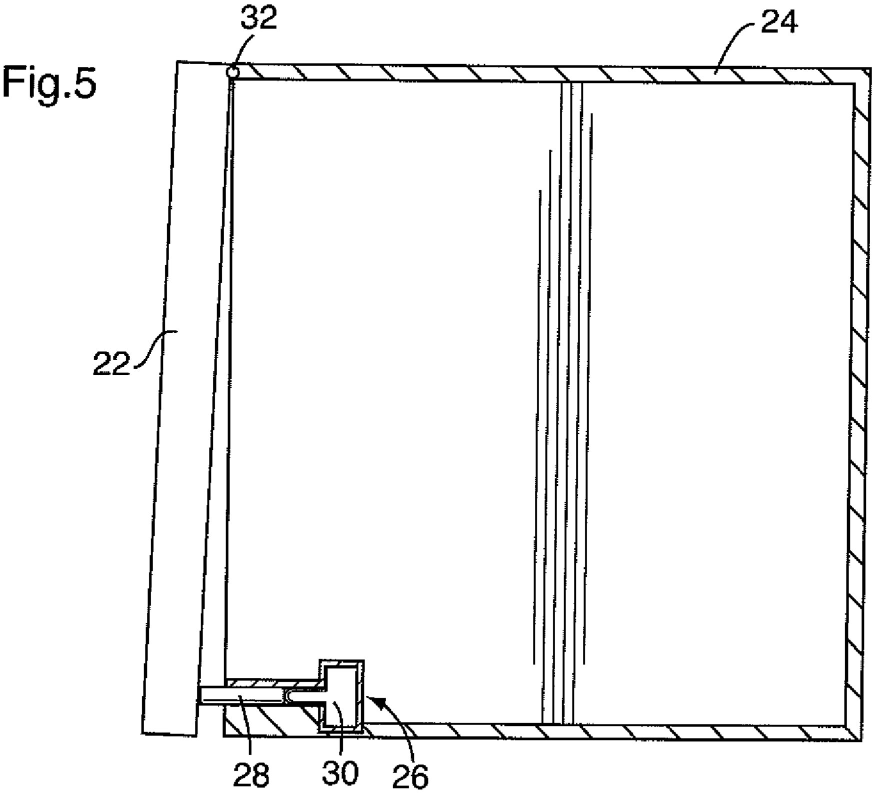
FIG. 5 cross-sectional view of the display unit in FIG. 3, showing the screen pivoted to an open position for operation at elevated temperatures.

A person of skill in the art will appreciate that any of a plurality of thermal actuators may be used. In one embodiment, a mechanical actuator 26 is provided wherein the linear translation element is a piston 28 adapted to be pushed by the thermal expansion of a fluid, such as wax, from an expansion conduit of a reservoir 30 (i.e. the stationary component connected to the chassis 24), as shown in FIGS. 4 and 5. As the wax expands and the piston 28 extends, the screen 22 is caused to pivot about a hinge 32. One benefit of the actuator shown in FIGS. 4 and 5 is that it requires no external power input. Alternatively, the actuator 26 may comprise any of a temperature sensor with a solenoid, a MEMs thermal actuator, electrostatic, magnetic, or piezoelectric device. When the temperature drops below the activation temperature, wax within reservoir 30 contracts thereby allowing the piston 28 to retract (e.g. under spring biasing) so that the screen returns to the closed configuration of FIG. 4

While generally described within the framework of 'multi-tiled' displays, the thermal actuator set forth herein can be suitably applied to other imaging units, such as multiple displays in a control room.

It will be appreciated that, although embodiments have been described and illustrated in detail, various modifications and changes may be made. While several embodiments are described above, some of the features described above can be modified, replaced or even omitted. All such alternatives and modifications are believed to be within the scope of the invention and are covered by the claims appended hereto.

The invention claimed is:

1. A plurality of display units, each of said plurality of display units comprising:

a chassis;

a screen pivotally connected to said chassis; and at least one of said plurality of display units having a thermal actuator connected to said chassis and in contact with said screen for pivoting the screen away from said chassis when said display unit exceeds a predetermined temperature, wherein when at or below said predetermined temperature, said screen of a display unit of said plurality of display units is closed against said chassis and there is a gap between said screen of said display unit and said screen of an adjacent display unit of said plurality of display units, and wherein when above said predetermined temperature, said screen of said display unit is pivoted away from said chassis so as to prevent damage resulting from interference between said screen of said display unit and said screen of said adjacent display unit.

2. The plurality of display units of claim 1, wherein said thermal actuator includes a stationary component mounted to said chassis, and a linear translation element in contact with the screen and adapted to be moved by the stationary component so as to push the pivotally connected screen outward and away from the chassis above said predetermined temperature.

3. The plurality of display units of claim 1, wherein said chassis has a coefficient of thermal expansion that is less than a coefficient of thermal expansion of the screen.

4. The plurality of display units of claim 1, wherein said chassis is made of a material selected from aluminium, magnesium, glass filled nylon, or any combination thereof.

5. The plurality of display units of claim 2, wherein said stationary component comprises a reservoir containing a thermal expanding fluid, said reservoir including an expansion conduit, and wherein said linear translation element comprises a piston adapted to be pushed by thermal expansion of said fluid from said reservoir into said expansion conduit.

6. For use in an imaging system having a plurality of adjacent display units, each of the plurality of adjacent display units including a chassis and a screen pivotally connected to said chassis;

the improvement comprising a thermal actuator in at least one of said plurality of adjacent display units for at least in part moving said screen of said at least one of said plurality of adjacent display units away from said chassis thereof, wherein when at or below a predetermined temperature, said screen of said at least one of said plurality of adjacent display units is closed against said chassis and there is a gap between said screen of said at least one of said plurality of adjacent display units and said screen of an adjacent display unit of said plurality of adjacent display units, and wherein when said at least one of said plurality of adjacent display units exceeds said predetermined temperature, said screen of said at least one of said plurality of adjacent display units is at least in part moved away from said chassis by the thermal actuator so as to prevent damage resulting from interference between said screen of said display unit and said screen of said adjacent display unit.

7. The improvement of claim 6, wherein moving said screen comprises pivoting said screen away from said chassis.

8. The improvement of claim 6, herein said thermal actuator includes a stationary component mounted to said chassis, and a linear translation element in contact with the screen and adapted to be moved by the stationary component so as to push the pivotally connected screen outward and away from the chassis above said predetermined temperature.

9. The improvement of claim 8, wherein said stationary component comprises a reservoir containing a thermal expanding fluid, said reservoir including an expansion conduit, and wherein said linear translation element comprises a piston adapted to be pushed by thermal expansion of said from said reservoir into said expansion conduit.

* * * * *

UNITED STATES PATENT AND TRADEMARK OFFICE

CERTIFICATE OF CORRECTION

PATENT NO. : 8,611,072 B2
APPLICATION NO. : 12/781115
DATED : December 17, 2013
INVENTOR(S) : Daniel Robert Adema, Bryan Russell Hemphill and Les Hirst It is certified that error appears in the above-identified patent and that said Letters Patent is hereby corrected as shown below:

In the Claims

Column 6, line 7, Claim 8, "herein" should read -- wherein --.

Signed and Sealed this
Twenty-fifth Day of November, 2014

Michelle K. Lee

Michelle K. Lee
*Deputy Director of the United States Patent and Trademark Office*